(12) United States Patent
Kono et al.

(10) Patent No.: US 7,795,886 B2
(45) Date of Patent: Sep. 14, 2010

(54) SURFACE VOLTMETER

(75) Inventors: Motohiro Kono, Kyoto (JP); Toshikazu Kitajima, Kyoto (JP); Kazuhiko Fuse, Kyoto (JP); Yoshiyuki Nakazawa, Kyoto (JP)

(73) Assignee: Dainippon Screen Mgf. Co., Ltd., Kyoto (JP)

( * ) Notice: Subject to any disclaimer, the term of this patent is extended or adjusted under 35 U.S.C. 154(b) by 346 days.

(21) Appl. No.: 12/076,887

(22) Filed: Mar. 25, 2008

(65) Prior Publication Data
US 2008/0238434 A1    Oct. 2, 2008

(30) Foreign Application Priority Data
Mar. 29, 2007    (JP)    .......................... P2007-086248

(51) Int. Cl.
*G01R 31/302*    (2006.01)
(52) U.S. Cl. ...................... 324/751; 324/752
(58) Field of Classification Search ......... 324/750–752, 324/72.5
See application file for complete search history.

(56) References Cited

U.S. PATENT DOCUMENTS 4,393,348 A * 7/1983 Goldstein et al. ........... 324/765

2004/0212377 A1* 10/2004 Ebara ........................ 324/750

FOREIGN PATENT DOCUMENTS

JP    06-088846    3/1994

* cited by examiner

*Primary Examiner*—Vincent Q Nguyen
(74) *Attorney, Agent, or Firm*—McDermott Will & Emery LLP

(57) ABSTRACT

In a surface voltmeter (1), a surface voltage on a measurement area on a semiconductor substrate (9) on which an insulating film is formed is measured while applying light to the measurement area. With this operation, a voltage induced on a main body of the substrate (9) by charge which is charged on a surface of the insulating film is balanced out. Consequently, it is possible to measure a surface voltage on the measurement area with high accuracy. Since an electrode wiring (164) used for application of an electrode voltage to an electrode (12) extends from the electrode (12) in a direction away from the substrate (9) along a vibration direction, it is possible to prevent influences of noises caused by vibration of the electrode wiring (164) in vibrating the electrode (12) and to measure the surface voltage on the measurement area more accurately.

18 Claims, 8 Drawing Sheets

SURFACE VOLTMETER

BACKGROUND OF THE INVENTION

1. Field of the Invention

The present invention relates to a surface voltmeter for measuring a surface voltage on a semiconductor substrate.

2. Description of the Background Art

Conventionally, a noncontact-type surface voltmeter has been used for measuring a surface voltage (surface potential) on a photoconductor drum of a copy machine or a substrate having ICs mounted thereon. Japanese Patent Application Laid-Open No. 6-88846 (Document 1) discloses a probe for a DC type surface voltmeter for measuring photo-induced discharge characteristics of a charged photoreceptor or the like. In the probe, an optical fiber coated with a transparent conductive film is used as a detecting electrode and light can be applied to a small measurement area which is close to the detecting electrode at a small distance.

Some types of surface voltmeters utilize an alternative method. In the alternative method, an electrode which vibrates at a predetermined amplitude is positioned close to an object to be measured, and a surface voltage is obtained on the basis of a displacement current from the electrode which is generated by change of a capacitance between the electrode and the object. In Document 1, it is described that the above probe may be also used in measurement of a surface voltage by the alternative method.

In recent years, the surface voltmeter which utilizes the alternative method has been also used in measurement of an amount of charge which is charged on a surface of an insulating film such as an oxide film formed on a semiconductor substrate. However, a surface voltage measured by a normal surface voltmeter is a sum of a voltage generated by the charge which is charged on the surface of the insulating film and a voltage (hereinafter, referred to as "induced voltage (induced potential)") generated by hole(s) or electron(s) which is induced in the vicinity of a boundary between the main body of the semiconductor substrate and the insulating film, by the charged charge. For precisely measuring only the voltage generated by the charge which is charged on the surface of the insulating film, it is considered that light having an energy over a band gap of a semiconductor is applied to the semiconductor substrate and excessive electron-hole pairs are generated in an irradiation region to make the induced voltage approximately 0, and then a surface voltage is measured.

In measurement of the surface voltage on the semiconductor substrate, since the electrode is positioned very close to the semiconductor substrate for improving the measurement accuracy, it is difficult that a light source is located on a side of the electrode and light is applied to a measurement area from a small space between the electrode and the semiconductor substrate. If the surface voltmeter of Document 1 is applied to measurement of the surface voltage on the semiconductor substrate, though it is possible to apply light to the measurement area, the surface voltmeter is for measuring the photo-induced discharge characteristics of the photoreceptor or the like and it is therefore expected that high measurement accuracy is difficult to acquire. Also, since a plurality of optical fibers and insulation material, guard electrodes and the like which are provided around the plurality of optical fibers should be vibrated as a unit, the load applied on a vibration part in vibrating is increased.

As one of surface voltmeters for performing measurement while applying light to a substrate, a surface voltmeter having a construction where a light source is positioned above a transparent electrode facing a semiconductor substrate and an electromagnetic siren type-vibration part for holding an upper surface of the transparent electrode from its side is provided has been known. In the surface voltmeter, normally, a lower surface of the vibration part (i.e., the lower surface facing the semiconductor substrate) is covered with a cover and an electrode wiring through which a displacement current from the transparent electrode flows extends in the horizontal direction between the vibration part and the cover.

In such a surface voltmeter, however, since noise components caused by a stray capacitance between the cover and the electrode wiring which is vibrated together with the transparent electrode and a stray capacitance between the cover and the vibration part are generated in vibrating the electrode by the vibration part, it is difficult to perform high accurate measurement of a surface voltage required for evaluation of a semiconductor substrate.

SUMMARY OF THE INVENTION

The present invention is intended for a surface voltmeter for measuring a surface voltage on a semiconductor substrate on which an insulating film is formed. It is an object of the present invention to measure a surface voltage on a measurement area on the semiconductor substrate with high accuracy.

The surface voltmeter comprises: a substrate holding part for holding a semiconductor substrate; an electrode facing a measurement area on the semiconductor substrate in a non-contact manner and having transparency; a light source whose relative position to the substrate holding part is fixed; a reflective part which reflects light emitted from the light source and directs reflected light to an irradiation region including the measurement area through the electrode; a vibration part for vibrating the electrode in a vibration direction toward the measurement area, together with the reflective part; an electrode wiring which is electrically connected to the electrode and extends from the electrode in a direction away from the semiconductor substrate; and an operation part for obtaining a surface voltage on the measurement area on the basis of an electrode voltage applied to the electrode through the electrode wiring and a displacement current from the substrate holding part in vibrating the electrode or a displacement current from the electrode acquired through the electrode wiring in vibrating the electrode. According to the present invention, it is possible to measure a surface voltage on the measurement area on the semiconductor substrate on which an insulating film is formed, with high accuracy.

According to a preferred embodiment of the present invention, the surface voltmeter further comprises a light guiding member which is a pillar shape extending in the vibration direction and connects the reflective part and the electrode, the light guiding member directing the reflected light reflected on the reflective part to the electrode, and in the surface voltmeter, the electrode wiring is a metal film provided on an outer peripheral surface of the light guiding member. More preferably, the electrode wiring covers a whole of the outer peripheral surface of the light guiding member.

According to another preferred embodiment of the present invention, the irradiation region is larger than the measurement area, and more preferably, a distance between an outer peripheral edge of the irradiation region and that of the measurement area is equal to or larger than 50 μm (micrometer).

According to still another preferred embodiment of the present invention, the reflective part is a prism.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
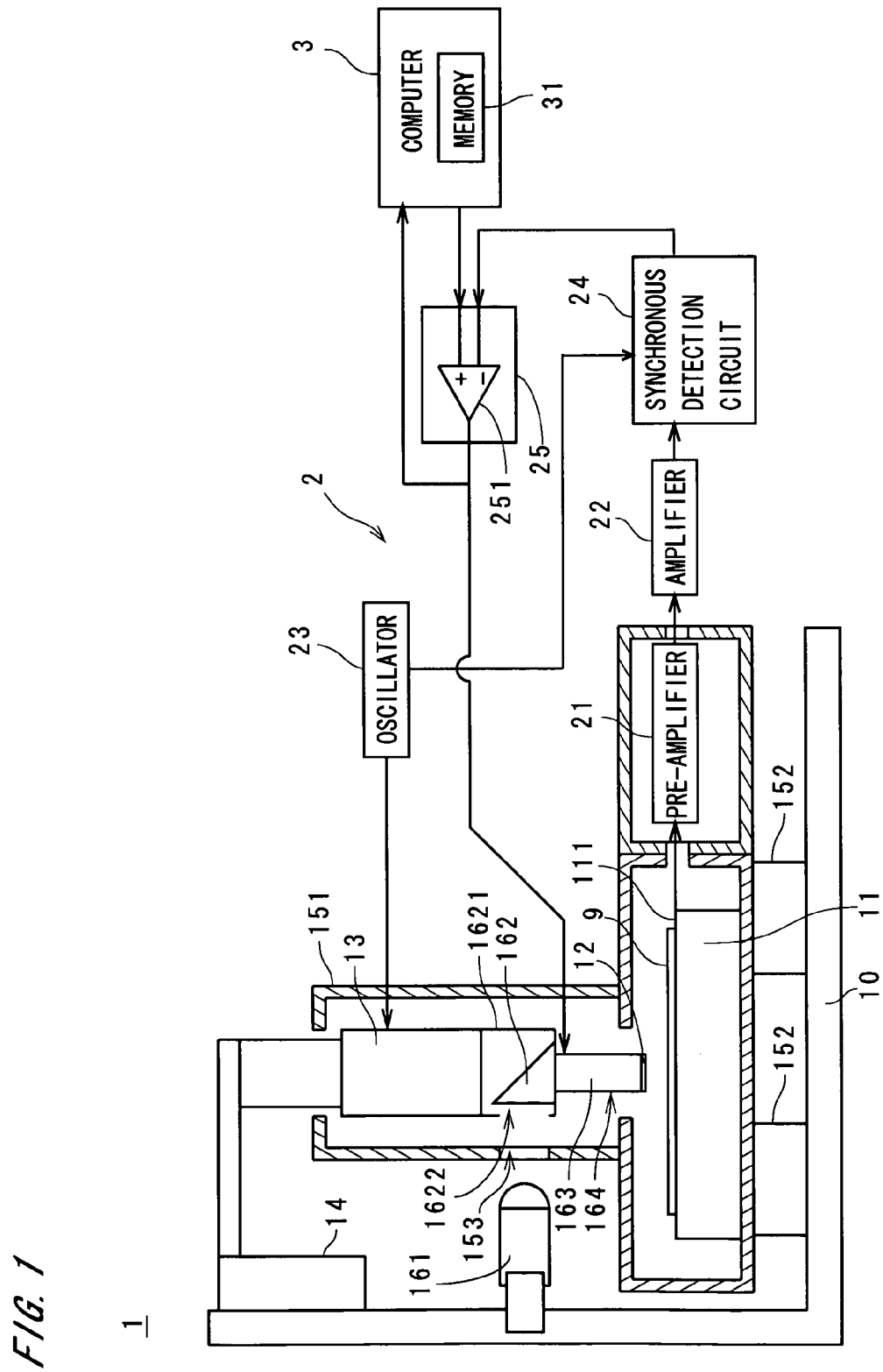
FIG. 1 is a view showing a construction of a surface voltmeter in accordance with the first preferred embodiment.

FIG. 1 is a view showing a construction of a surface voltmeter 1 in accordance with the first preferred embodiment of the present invention. The surface voltmeter 1 measures a surface voltage (surface potential) on a semiconductor substrate 9 on which an insulating film such as an oxide film is formed, with using a vibrating capacitor method that is a kind of alternative method. The semiconductor substrate 9 is formed of silicon (Si) in the present preferred embodiment and hereinafter, simply referred to as a "substrate 9". The surface voltmeter 1 has a substrate holding part 11 on which the substrate 9 is placed and held, an electrode 12 facing a measurement area on a front surface (upper surface) of the substrate 9 in a noncontact manner and having transparency, a vibration part 13 which has a piezoelectric device (i.e., piezo actuator) and is located above the electrode 12 (located on a side which is opposite to the substrate holding part 11 of the electrode 12), and an elevating mechanism 14 for moving the electrode 12 up and down.

A prism housing part 1621 in which a right-angle prism 162 is housed is fixed on a lower surface of the vibration part 13 (i.e., fixed on the electrode 12 side of the vibration part 13), and a cylindrical glass rod 163 extending in the up and down direction of FIG. 1 is bonded to a lower surface of the right-angle prism 162 with use of optical adhesive. An upper end surface of the glass rod 163 is smaller than the lower surface of the right-angle prism 162 and the electrode 12 is formed on a lower end surface of the glass rod 163. In other words, the right-angle prism 162 and the electrode 12 are connected with interposing the glass rod 163.

An electrode wiring 164, which is electrically connected to the electrode 12 and extends from the electrode 12 in a direction away from the substrate 9 and the substrate holding part 11 (extends from the electrode 12 on a side which is opposite to the substrate 9 and the substrate holding part 11 of the electrode 12), is provided on an outer peripheral surface of the glass rod 163. The electrode wiring 164 is a metal film which is formed on the outer peripheral surface of the glass rod 163 by vacuum evaporation or the like and covers the whole of the outer peripheral surface of the glass rod 163. In the present preferred embodiment, the electrode wiring 164 has a chromium (Cr) layer of a thickness of 2 nm (nanometer) which is formed on the outer peripheral surface of the glass rod 163 by vacuum evaporation and a gold (Au) layer of a thickness of about 1 μm which is formed on the chromium layer. In this case, for example, a gold layer of a thickness of 300 nm is formed on the chromium layer by vacuum evaporation, and the thickness of the gold layer is made to 1 μm by the plating.

The substrate holding part 11 has a conductive surface 111 contacting a rear surface (lower surface) of the substrate 9, and an area of the conductive surface 111 is much larger than that of a lower end of the electrode 12. The substrate holding part 11 is an XY stage and moves the substrate 9 in horizontal directions so that the desired portion of the substrate 9 faces the electrode 12. The vibration part 13 vibrates the electrode 12 in a vibration direction toward the measurement area on the substrate 9 (i.e., the vibration direction is the up and down direction of FIG. 1), together with the right-angle prism 162, the prism housing part 1621, and the glass rod 163. The vibration part 13 is connected to the elevating mechanism 14 and a distance in the vibration direction between the electrode 12 and the substrate 9 is changed by driving the elevating mechanism 14. An amplitude of the electrode 12 which is vibrated by the vibration part 13 is made to 20 to 30 μm in the present preferred embodiment.

In the surface voltmeter 1, the electrode 12, the glass rod 163, the electrode wiring 164, the right-angle prism 162, the prism housing part 1621, the vibration part 13, the substrate 9, and the substrate holding part 11 are covered with a cover 151. The cover 151 and the substrate holding part 11 are supported by a flame 10 with interposing vibration isolation members 152.

The surface voltmeter 1 has a light source 161 which is positioned by the side of the right-angle prism 162 and is positioned outside the cover 151, and the light source 161 emits light toward the right-angle prism 162. The light source 161 is fixed to the flame 10. In other words, the light source 161 is positioned independently of the electrode 12, the right-angle prism 162, the vibration part 13 and the like, and a relative position of the light source 161 to the substrate holding part 11 is fixed.

The light emitted from the light source 161 enters the right-angle prism 162 through a window part 153 formed in the cover 151 and an opening 1622 formed in the prism housing part 1621, and the light is reflected on the right-angle prism 162 and applied to the front surface of the substrate 9 through the glass rod 163 and the electrode 12. In the present preferred embodiment, a transparent electrode such as an ITO (Indium Tin Oxide) electrode is used as the electrode 12, and an LED (Light Emitting Diode) for emitting light whose wavelength is equal to or larger than 230 nm and equal to or smaller than 800 nm is used as the light source 161.

Figure 2:
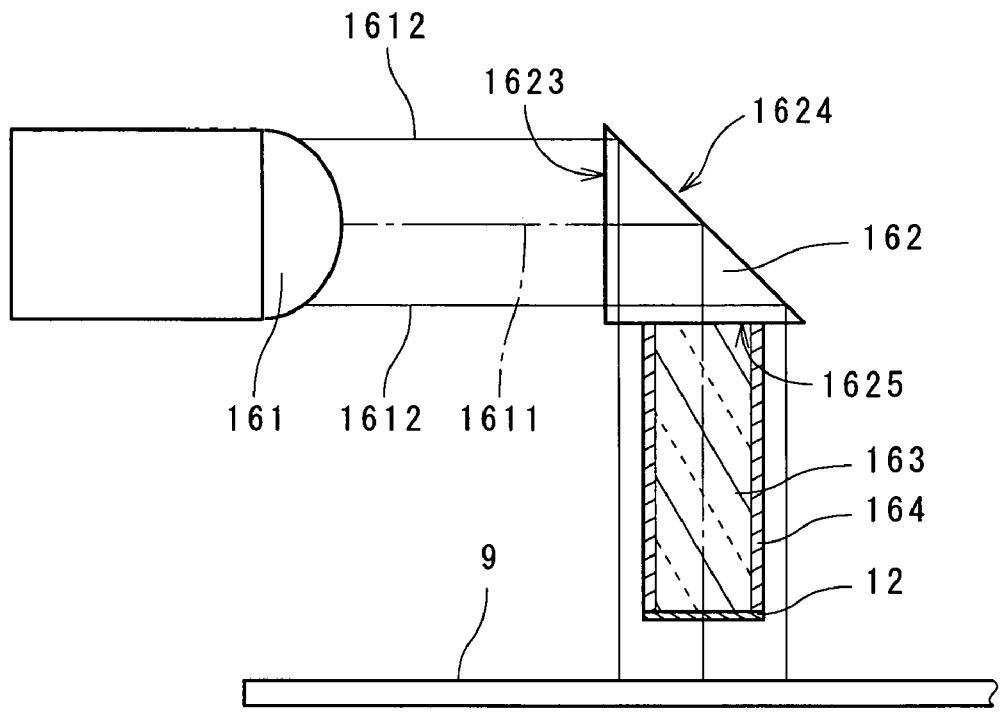
FIG. 2 is an enlarged view showing the vicinity of an electrode and a light source.

FIG. 2 is an enlarged view showing the vicinity of the electrode 12 and the light source 161. In FIG. 2, the glass rod 163, the electrode wiring 164 and the electrode 12 are shown cross-sectionally for easy understanding of illustration and the thicknesses of the electrode wiring 164 and the electrode 12 are shown thicker than they are. The central line and the contour of an optical path of the light from the light source 161 are shown by a one-dot chain line 1611 and solid lines 1612, respectively. The cover 151 and the prism housing part 1621 are omitted in FIG. 2.

As shown in FIG. 2, the light emitted from the light source 161 enters from a vertical side surface 1623 of the right-angle prism 162 to be totally reflected on an inclined surface 1624, and reflected light efficiently goes to the lower surface 1625 of the right-angle prism 162 and a part of the reflected light enters the glass rod 163 through the lower surface 1625. Light entering the glass rod 163 is directed to the electrode 12 and emitted toward the substrate 9 from the electrode 12. Light which does not enter the glass rod 163 out of the reflected light reflected on the inclined surface 1624 of the right-angle prism 162 is emitted toward the substrate 9 from around a bonded portion between the lower surface 1625 of the right-angle prism 162 and the glass rod 163.

In the surface voltmeter 1, the right-angle prism 162 serves as a reflective part which reflects the light emitted from the light source 161 and directs the reflected light to an irradiation region on the substrate 9 through the glass rod 163 and the electrode 12. The glass rod 163 serves as a light guiding member for directing the reflected light reflected on the reflective part to the electrode 12.

Figure 3:
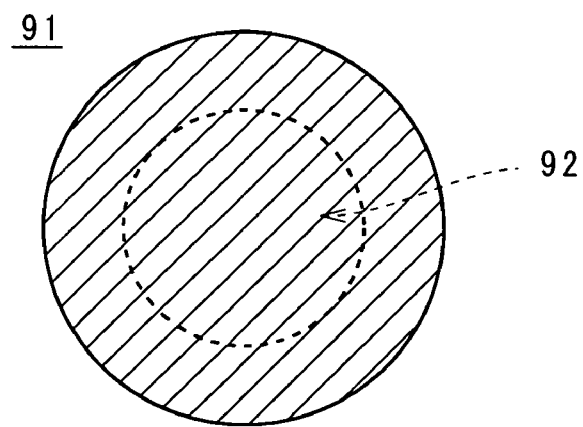
FIG. 3 is an enlarged plan view showing an irradiation region.

FIG. 3 is an enlarged plan view showing an irradiation region 91 on the substrate 9 (see FIG. 2) irradiated with the light from the electrode 12 and the right-angle prism 162. In FIG. 3, the irradiation region 91 is hatched for easy understanding of illustration. An area 92 which overlaps with the electrode 12 in the plan view (i.e., the area 92 faces the electrode 12) is surrounded by a broken line in FIG. 3. The area 92 is a measurement object of a surface voltage by the surface voltmeter 1 and hereinafter, referred to as a "measurement area 92". As shown in FIG. 3, the irradiation region 91 is larger than the measurement area 92, and the measurement area 92 is included in the irradiation region 91. An outer peripheral edge of the irradiation region 91 and that of the measurement area 92 are concentric, and a distance between the outer peripheral edge of the irradiation region 91 and that of the measurement area 92 is made to be equal to or larger than 50 μm and equal to or smaller than 2 mm (the distance is about 1 mm in the present preferred embodiment).

The surface voltmeter 1 shown in FIG. 1 has a processing part 2 which is a group of circuits for processing various electrical signals and devices and a computer 3 which is an operation part. The processing part 2 has a pre-amplifier 21 which converts a small current generated and transmitted from the conductive surface 111 of the substrate holding part 11 into a voltage and amplifies the voltage, an amplifier 22 for further amplifying a signal from the pre-amplifier 21, an oscillator 23 for applying a signal for vibration to the vibration part 13, a synchronous detection circuit 24 to which signals from the oscillator 23 and the amplifier 22 are inputted, and a control circuit 25 including an operational amplifier 251. A current from the conductive surface 111 is an alternating current which is generated by change of a capacitance between the electrode 12 and the substrate 9 while vibrating the electrode 12, and the current is hereinafter referred to as a "displacement current".

In the pre-amplifier 21, a voltage converted from a current value is amplified by approximately 10 to the 10th power times, and further amplified by approximately 10 squared times in the amplifier 22. With this operation, for example, a current of 10 fA (femtoampere) is directed to the operational amplifier 251 as a voltage of about 1 mV. A voltage from the control circuit 25 is applied to the electrode 12 through the electrode wiring 164. A voltage indicating a displacement current from the amplifier 22 and a signal from the oscillator 23 are inputted to the synchronous detection circuit 24, and an amplitude of the displacement current is outputted from the synchronous detection circuit 24 as an amount of displacement current and inputted to an inverting input terminal (−) of the operational amplifier 251 in the control circuit 25.

A current indicating voltage for indicating an amount of displacement current is inputted to a non-inverting input terminal (+) of the operational amplifier 251 from the computer 3, and the operational amplifier 251 applies a voltage (electrical potential) to the electrode 12 through the electrode wiring 164 so that an inputted voltage from the synchronous detection circuit 24 is equal to the current indicating voltage. In other words, the processing part 2 performs feedback control with the operational amplifier 251 and a voltage of the electrode 12 (hereinafter, referred to as "electrode voltage (electrode potential)") where a value of the displacement current from the conductive surface 111 is made to be equal to an indicated current value is obtained. The voltage determined by the control circuit 25 is directly acquired by the computer 3.

Figure 4:
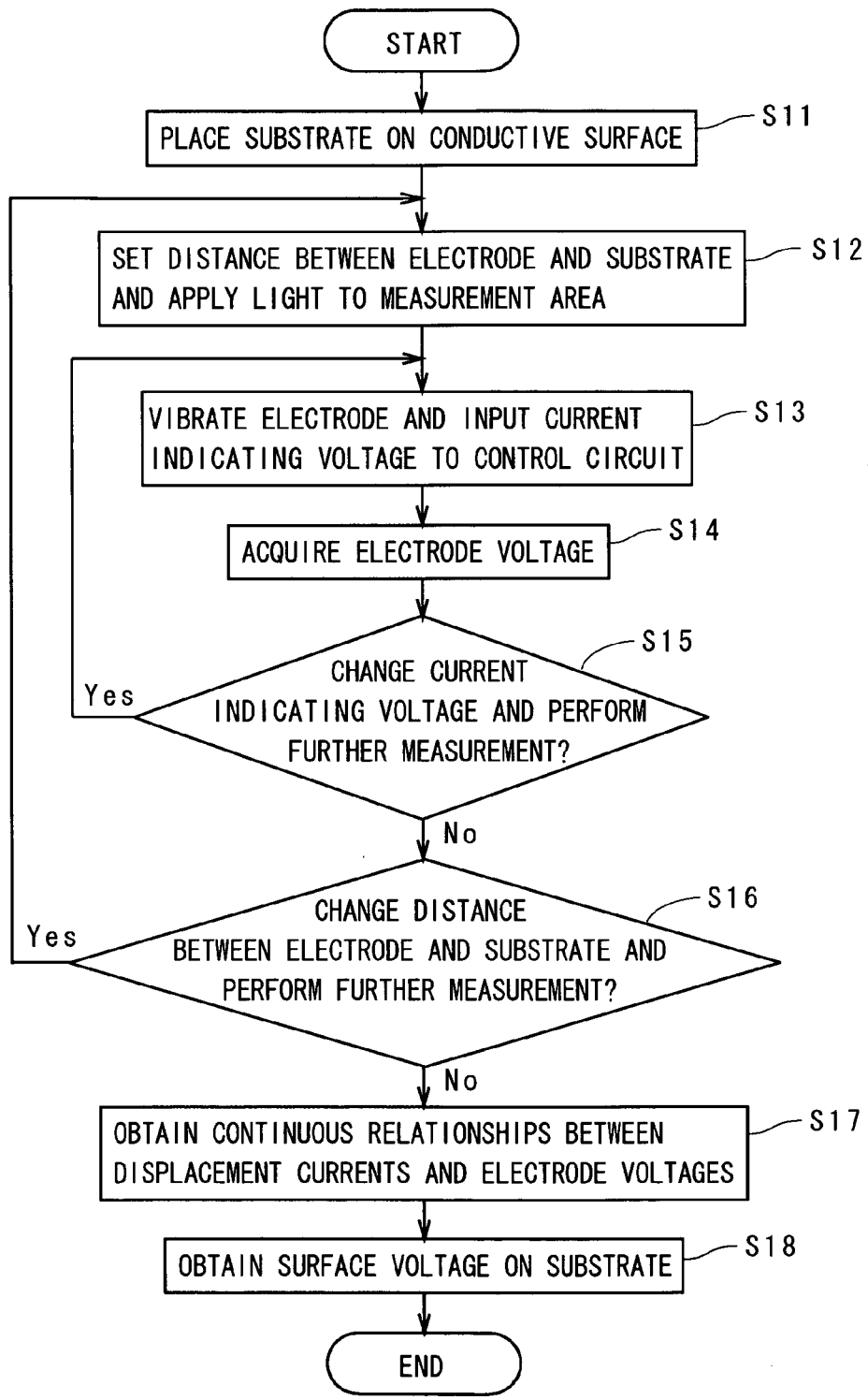
FIG. 4 is a flowchart showing an operation flow for measuring a surface voltage in the surface voltmeter.

FIG. 4 is a flowchart showing an operation flow of the surface voltmeter 1 in measuring a surface voltage on the substrate 9. First, the substrate 9 is placed on the conductive surface 111 so that the rear surface of the substrate 9 contacts the conductive surface 111 of the substrate holding part 11 (Step S11), and the electrode 12 faces the front surface of the substrate 9 and the conductive surface 111 in a noncontact manner. The elevating mechanism 14 sets a distance between the electrode 12 and the front surface of the substrate 9 (or the conductive surface 111) to a predetermine distance. In this time, a distance in the vibration direction between the electrode 12 and the measurement area 92 on the substrate 9 (see FIG. 3) is made to be equal to or larger than 50 μm and equal to or smaller than 500 μm. In the present preferred embodiment, the distance is made to 250 μm. Then, emission of the light from the light source 161 is started and the light is applied to the irradiation region 91 including the measurement area 92 on the substrate 9 (Step S12).

Vibration of the electrode 12 in the vibration direction toward the substrate 9 is started by the vibration part 13 and a predetermined current indicating voltage is inputted from the computer 3 to the control circuit 25 (Step S13). With this operation, feedback control is performed on an electrode voltage so that a value of the displacement current (i.e., the maximum value of an absolute value of current) from the conductive surface 111 of the substrate holding part 11 is made to be equal to a value indicated by the current indicating voltage. Then, the above electrode voltage is inputted to the computer 3 (Step S14).

After acquisition of the electrode voltage, the operation is returned back to Step S13 (Step S15), the current indicating voltage is changed to perform reacquisition of the electrode voltage (Steps S13, S14). Change of the current indicating voltage and acquisition of the electrode voltage are repeated a plurality of times (Steps S13 to S15), to obtain a relationship between the displacement current and the electrode voltage (i.e., a plurality of combinations between the displacement currents and the electrode voltages) in vibrating the electrode 12.

After a relationship between the displacement current and the electrode voltage is obtained by the operation of the processing part 2 (and instructions from the computer 3) in a state where the distance between the electrode 12 and the substrate 9 is kept constant, the operation is returned back to Step S12 (Step S16), the elevating mechanism 14 changes the distance between the electrode 12 and the front surface of the substrate 9, and change of the current indicating voltage and acquisition of the electrode voltage are repeated a plurality of times to obtain a relationship between the displacement current and the electrode voltage (Steps S12 to S15). Then, change of the distance between the electrode 12 and the front surface of the substrate 9 and acquisition of the relationship between the displacement current and the electrode voltage are repeated a predetermined times, to obtain a plurality of relationships between the displacement current and the electrode voltage (Steps S12 to S16).

Figure 5:
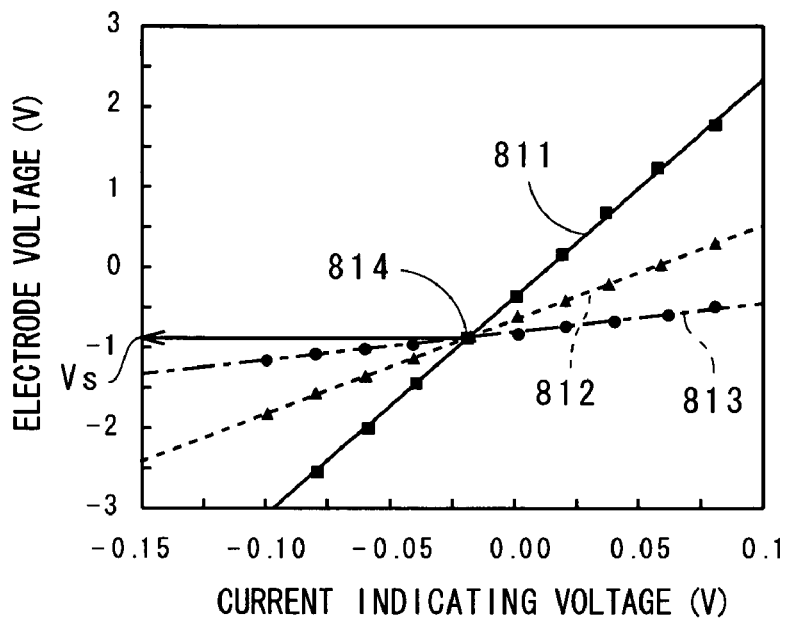
FIG. 5 is a graph showing relationships between a current indicating voltage and an electrode voltage.

FIG. 5 is a graph showing relationships between the current indicating voltage (i.e., displacement current) and the electrode voltage. Rectangular dots represent combinations (discrete relationship) between the current indicating voltages and the electrode voltages which are obtained in a state where the distance between the electrode 12 and the front surface of the substrate 9 is kept constant. A solid line 811 is a straight line which is obtained from the rectangular dots with the least squares method and represents a continuous linear relationship between the displacement current and the electrode voltage. Triangular dots represent measurement results which are obtained in a state where the distance between the electrode 12 and the front surface of the substrate 9 is made shorter than that in the above case of rectangular dots. Circular dots represent measurement results which are obtained in a state where the distance between the electrode 12 and the front surface of the substrate 9 is made still shorter than that in the case of triangular dots. A broken-line 812 is a straight line derived from the triangular dots and a one-dot chain line 813 is a straight line derived from the circular dots.

As shown by the straight lines 811 to 813 in FIG. 5, the relationship between the displacement current and the electrode voltage is represented linearly, and as the distance between the electrode 12 and the front surface of the substrate 9 increases, the tilt angle of line increases. The straight lines 811 to 813 meet at a point 814. It is confirmed that if the distance between the electrode 12 and the front surface of the substrate 9 is further changed to obtain another straight line, the another straight line passes through the point 814. Since the relationship between the displacement current and the electrode voltage at the point 814 is independent from the distance between the electrode 12 and the front surface of the substrate 9, it is assumed that the displacement current is not actually generated at the point 814 by change of the capacitance between the electrode 12 and the substrate 9. Therefore, in principle, it is presumed that the electrode voltage (hereinafter, referred to as "reference voltage Vs") and the surface voltage on the substrate 9 are equal at the point 814. In other words, a measurement value of the displacement current at the point 814 is not 0 because of various factors such as shape of the electrode 12, but it can be achieved that a deviation from 0 of the displacement current is swept by determining the point 814, to obtain the reference voltage Vs.

In accordance with the above-discussed technique, the above-discussed plurality of straight lines 811 to 813 representing the plurality of continuous relationships are obtained in the computer 3 on the basis of the plurality of discrete relationships between the displacement currents and the electrode voltages which are acquired through control of the processing part 2 (Step S17), and the reference voltage Vs is obtained as the surface voltage on the measurement area 92 on the substrate 9 by determining the intersection point 814 of the plurality of straight lines 811 to 813 (Step S18).

In the surface voltmeter 1, it is possible to obtain the relationship between the displacement current and the electrode voltage by specifying the electrode voltage and detecting a value of the displacement current, however in this case, a difference between the specified electrode voltage and the surface voltage on the substrate 9 can be large and it increases measurement errors. In the surface voltmeter 1, by specifying a relatively small value as a value of the displacement current, the difference between the electrode voltage and the surface voltage can be made an approximately desired extent and a measurement result can be stably obtained.

In the surface voltmeter 1, since an accurate electrode voltage is directly acquired by the processing part 2 and transmitted to the computer 3, it is possible to improve the accuracy of the obtained reference voltage and the measurement accuracy of the surface voltage on the substrate 9.

Next discussion will be made on a calibration (so-called zero calibration) performed by the surface voltmeter 1. As discussed above, in principle, the reference voltage obtained by the computer 3 is equal to the surface voltage on the substrate 9, however, if an allowable value of measurement errors is small, there is a case where a measurement result includes errors over the allowable value, depending on a state of the conductive surface 111 of the substrate holding part 11, materials or a state of surface of the electrode 12 or the substrate 9, or the like. In such a case, the calibration is performed in the surface voltmeter 1 in advance.

In the calibration, Steps S12 to S18 of FIG. 4 are performed in a state where the substrate 9 is not placed on the substrate holding part 11. A surface voltage obtained through Steps S12 to S18 is errors in the surface voltmeter 1 and the surface voltage is set to the computer 3 shown in FIG. 1 and stored in a memory 31. The substrate 9 is placed on the substrate holding part 11 and the above-discussed measurement operations are performed to obtain the reference voltage Vs of the electrode 12. Further, the value stored in the memory 31 is subtracted from the reference voltage Vs (or a value whose sign is changed is stored in the memory 31 and the value may be added to the reference voltage Vs), to obtain the final surface voltage. With this operation, it is possible to obtain the surface voltage on the substrate 9 with high accuracy.

Figure 6:
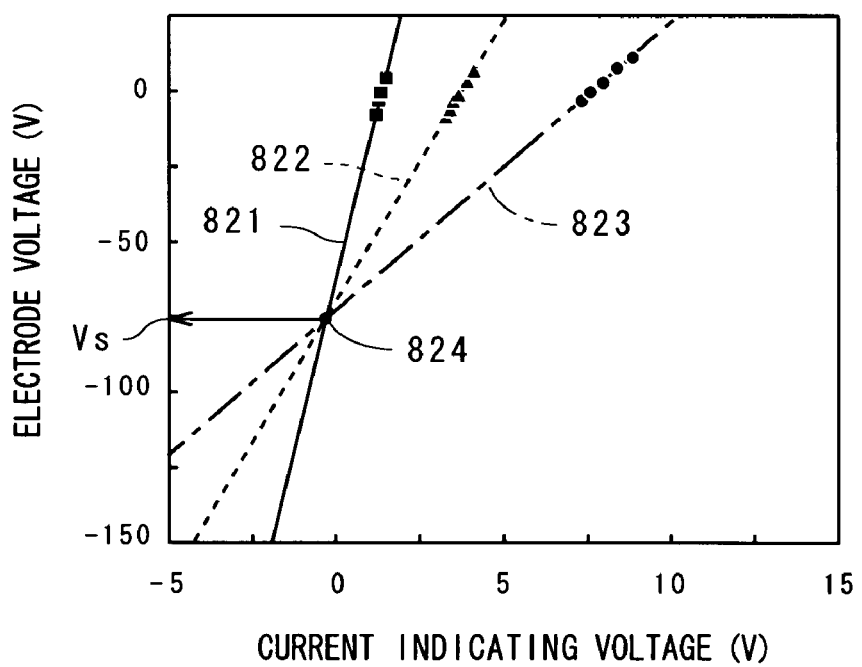
FIG. 6 is a graph showing another example of an operation for obtaining a reference voltage.

FIG. 6 is a graph showing another example of an operation for obtaining the reference voltage in the computer 3 and shows an example of measurement of a surface voltage which is out of a range of outputted voltage from the operational amplifier 251 shown in FIG. 1. Similarly to the case of FIG. 5, straight lines 821, 822 and 823 in FIG. 6 represent a plurality of continuous relationships between the displacement current and the electrode voltage which are obtained by changing the distance between the electrode 12 and the substrate 9, and the straight lines 821 to 823 meet at a point 824. Even if the absolute value of the surface voltage is large and the reference voltage Vs (and the surface voltage) is out of a range of the electrode voltage in measurement, the surface voltage can be obtained as long as the intersection point of the plurality of straight lines can be determined as shown in FIG. 6.

In the surface voltmeter 1, measurement can be performed in a range of voltage which can be generated by the operational amplifier 251, without providing a high voltage generator having a complicated control circuit, and it is possible to achieve simplification of the construction and reduction of the manufacturing costs of the surface voltmeter 1. Further, not applying a high voltage to the electrode 12 makes the use of the surface voltmeter 1 easy.

Though the above discussion has been made on the construction and the operation of the surface voltmeter 1, the surface voltmeter 1 can be used in easy measurement for easily confirming whether or not a surface voltage on a substrate is greatly different from a predicted surface voltage. Such an easy measurement is used, for example, in detecting a semiconductor substrate which is charged abnormally out of mass-produced semiconductor substrates.

In the easy measurement, setting of the distance between the electrode 12 and the substrate 9 in Step S12 shown in FIG. 4 and the processes of Steps S15 to S17 are omitted. Specifically, the distance between the electrode 12 and the substrate 9 is set in advance and the current indicating voltage is set so that the displacement current becomes 0. After the substrate 9 is placed and held on the substrate holding part 11 (Step S11), the electrode 12 is positioned at a predetermined position and light is applied to the irradiation region 91 including the measurement area 92 (Step S12), the vibration part 13 vibrates the electrode 12 and the current indicating voltage is inputted to the control circuit 25 (Step S13). With this operation, feedback control is performed so that the displacement current becomes 0 which is an indicated value, the electrode voltage is captured in the computer 3 and converted into a number indicating the electrode voltage by a predetermined computation (Step S14). That is to say, one combination between the displacement current of 0 and the electrode voltage is acquired to complete the easy measurement.

Since the displacement current is indicated to 0 in the easy measurement, the electrode voltage becomes a value close to the surface voltage and an error in measurement is approximately equal to an intrinsic error in the surface voltmeter 1. In other words, the surface voltage on the substrate 9 is acquired from the displacement current of 0 and the electrode voltage by the computer 3. Therefore, even in the easy measurement, it can be confirmed, e.g., whether or not abnormal charging which is over several hundreds of V occurs on the front surface of the substrate 9.

Though, in the above operation, the indicated value of the displacement current is made to 0 and the surface voltage is acquired from the electrode voltage without considering the displacement current, the indicated value of the displacement current may be another value other than 0 and in this case, a conversion equation or an offset value for obtaining the surface voltage from the electrode voltage is set in accordance with the indicated value of the displacement current and the surface voltage is easily obtained on the basis of the conversion equation or the offset value.

Figure 7A:
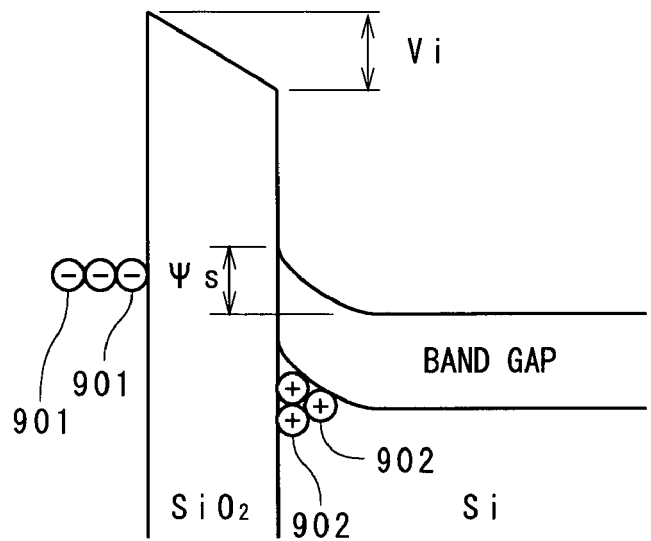
FIG. 7A is an energy band diagram in a measurement area on a substrate which is measured by a surface voltmeter in accordance with an example for comparison.
Figure 7B:
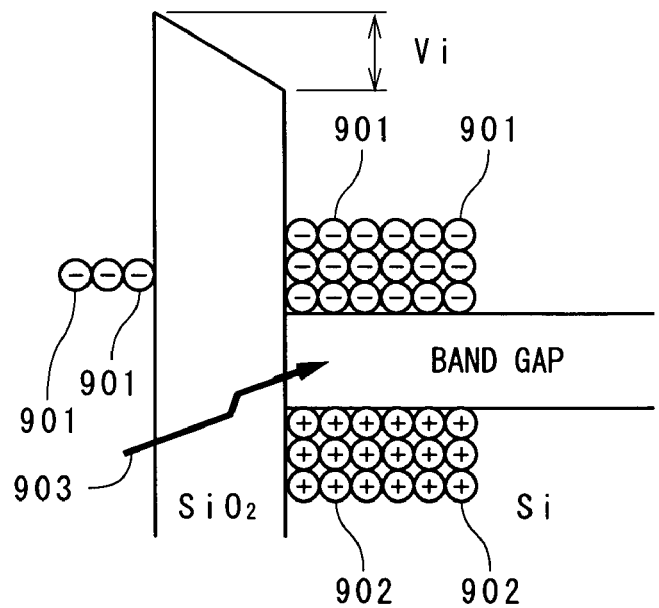
FIG. 7B is an energy band diagram in a measurement area on a substrate which is measured by the surface voltmeter in accordance with the first preferred embodiment.

Next discussion will be made on comparison between the surface voltmeter 1 and a surface voltmeter without performing light irradiation on a measurement area on a substrate. FIG. 7A is an energy band diagram in a measurement area on a substrate which is measured by a surface voltmeter in accordance with an example for comparison and FIG. 7A also shows a measured surface voltage. FIG. 7B is an energy band diagram in a measurement area on a substrate which is measured by the surface voltmeter 1 in accordance with the present preferred embodiment and similarly to FIG. 7A, FIG. 7B also shows a measured surface voltage. In FIGS. 7A and 7B, negative charge exists on a surface of an insulating film $SiO_2$ formed on the substrate.

In the surface voltmeter in accordance with the example for comparison, a sum of a voltage Vi generated by charge (i.e., electrons 901) which is charged on the surface of the insulating film $SiO_2$ and a voltage $\psi$ s (hereinafter, referred to as "induced voltage (induced potential) $\psi$ s") generated by holes 902 which are induced in the vicinity of a boundary between the main body Si of the substrate and the insulating film $SiO_2$ by the charged charge is measured as shown in FIG. 7A. Therefore, it is not possible to precisely measure a voltage generated by only the charge which is charged on the surface of the insulating film.

On the other hand, in the surface voltmeter 1 in accordance with the present preferred embodiment, the surface voltage on the measurement area 92 is measured while applying light to the irradiation region 91 including the measurement area 92 on the substrate 9 which is a semiconductor substrate on which the insulating film is formed. At this time, as shown in FIG. 7B, since light 903 applied to the irradiation region 91 has an energy over a band gap on the substrate 9, excessive electron 901-hole 902 pairs (which are, e.g., several thousands times as much as the holes 902 shown in FIG. 7A) are generated in the measurement area 92. As a result, the induced voltage on the main body Si of the substrate 9 which is induced by the charge (i.e., the electrons 901) charged on the surface of the insulating film $SiO_2$ is balanced out to become approximately 0. Measurement of the surface voltage is performed in the above state and it is possible to measure a surface voltage Vi on the measurement area 92 with high accuracy, the surface voltage Vi being generated by only the charge which is charged on the surface of the insulating film formed on the substrate 9.

In the surface voltmeter 1 in accordance the above preferred embodiment, since the electrode wiring 164 used for application of the electrode voltage to the electrode 12 extends from the electrode 12 in a direction away from the substrate 9 and the substrate holding part 11 along the vibration direction, it is possible to prevent influences of noises and the like caused by vibration of the electrode wiring 164 (e.g., influences by change of capacitance in the vibration direction between the electrode wiring 164 and the cover 151) in vibrating the electrode 12 and to measure the surface voltage on the measurement area 92 more accurately.

In the meantime, the electron-hole pairs generated by irradiation with light from the light source 161 move (i.e., drift) from an outer peripheral edge of the irradiation region 91 on the substrate 9 to a non-irradiation region outside the outer peripheral edge. Therefore, since an amount of electron-hole pairs in a portion close to the outer peripheral edge of the irradiation region 91 is smaller than that in a portion inside the above portion close to the outer peripheral edge (i.e., that in a central portion of the irradiation region 91), the induced voltage slightly remains in the portion close to the outer peripheral edge. In the surface voltmeter 1, the irradiation region 91 is defined so as to be larger than the measurement area 92 and include the measurement area 92, and thereby, the induced voltage is uniformly balanced out in the measurement area 92 to become approximately 0. As a result, it is possible to measure the surface voltage on the measurement area 92 with higher accuracy.

Since the distance between the outer peripheral edge of the irradiation region 91 and that of the measurement area 92 is made to be equal to or larger than 50 µm and it is possible to more surely prevent an area where the induced voltage remains in the irradiation region 91 from being included in the measurement area 92, high accurate measurement of a surface voltage on the measurement area 92 can be surely achieved. Also, since the distance between the outer peripheral edge of the irradiation region 91 and that of the measurement area 92 is made to be equal to or smaller than 2 mm, it is possible to prevent the irradiation region 91 from being excessively larger than the measurement area 92. That is to say, it is possible to prevent the right-angle prism 162, which reflects the light emitted from the light source 161 toward the substrate 9, from being excessively upsized, and to reduce the load applied on the vibration part 13 in vibrating.

In the surface voltmeter 1, the light source 161 is positioned by the side of the electrode 12, the right-angle prism 162 and the like, independently of a construction such as the electrode 12 and the right-angle prism 162 which are vibrated by the vibration part 13, and the relative position of the light source 161 to the substrate holding part 11 is fixed. With this structure, the light source 161 has a construction which does not vibrate in vibration of the electrode 12 and the like, and it is possible to further reduce the load applied on the vibration part 13 in vibrating. Since the light source 161 is positioned by the side of the electrode 12, the right-angle prism 162 and the like, the vibration part 13 having the piezoelectric device can be easily located above the electrode 12, thereby achieving simplification of the construction of the surface voltmeter 1. Further, since the right-angle prism 162 is used as a reflective part which reflects the light emitted from the light source 161 toward the substrate 9, it is possible to achieve weight reduction of a structure connected to the vibration part 13 and to further reduce the load applied on the vibration part 13 in vibrating.

The glass rod 163 for directing the reflected light reflected on the right-angle prism 162 to the electrode 12 is provided in the surface voltmeter 1, and it is therefore possible to surely direct the light emitted from the light source 161 to the electrode 12 while simplifying the construction of the surface voltmeter 1 and to surely apply the light to the measurement area 92 through the electrode 12. The electrode wiring 164 which extends from the electrode 12 in a direction away from the substrate 9 is made to a metal film provided on the outer peripheral surface of the glass rod 163, to thereby further simplify the construction of the surface voltmeter 1. Further, since the electrode wiring 164 covers the whole of the outer peripheral surface of the glass rod 163 without leaving any space, it is possible to prevent the outer peripheral surface of the glass rod 163 from being charged and to measure a surface voltage on the measurement area 92 more accurately.

Since the wavelength of the light emitted from the light source 161 is equal to or smaller than 800 nm, it is possible to surely generate electron-hole pairs in the irradiation region 91 on the substrate 9 and to surely achieve high accurate measurement of a surface voltage on the measurement area 92. Also, the wavelength of the light emitted from the light source 161 is made to be equal to or larger than 230 nm, to thereby prevent the substrate 9 from getting damaged by light irradiation.

In the surface voltmeter 1, the distance in the vibration direction between the electrode 12 and the measurement area 92 on the substrate 9 is made to be equal to or larger than 50 μm, and it is therefore possible to prevent the substrate 9 and the electrode 12 from contacting each other in vibration of the electrode 12 and also prevent damage to the electrode 12 and the substrate 9. Also, since the distance between the electrode 12 and the measurement area 92 is made to be equal to or smaller than 500 μm, it is possible to improve the measurement accuracy of a surface voltage on the measurement area 92.

Figure 8:
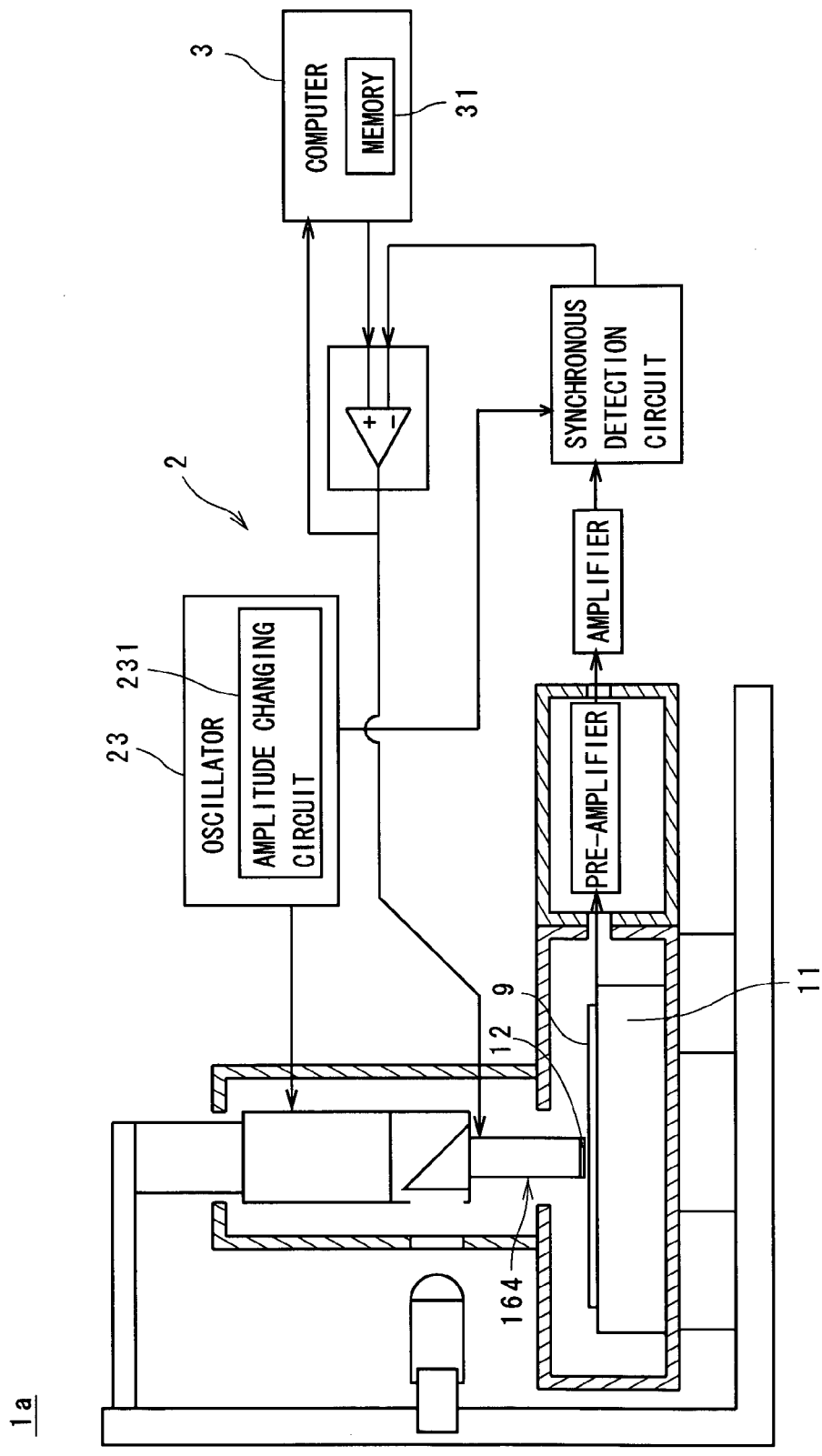
FIG. 8 is a view showing a construction of a surface voltmeter in accordance with the second preferred embodiment.

Next discussion will be made on a surface voltmeter in accordance with the second preferred embodiment of the present invention. FIG. 8 is a view showing a construction of a surface voltmeter 1a in accordance with the second preferred embodiment. In the surface voltmeter 1a, the elevating mechanism 14 for moving the electrode 12 up and down is omitted from the surface voltmeter 1 shown in FIG. 1 and the oscillator 23 of the processing part 2 is provided with an amplitude changing circuit 231. The other constituent elements are the same as those of the surface voltmeter 1 shown in FIG. 1 and represented by the same reference signs in the following description.

In measurement of a surface voltage by the surface voltmeter 1a, an amplitude of the electrode 12 is changed by the amplitude changing circuit 231, instead of the distance between the electrode 12 and the substrate 9 in Steps S12, S16 of FIG. 4. The other operations are the same as those of FIG. 4.

Figure 9:
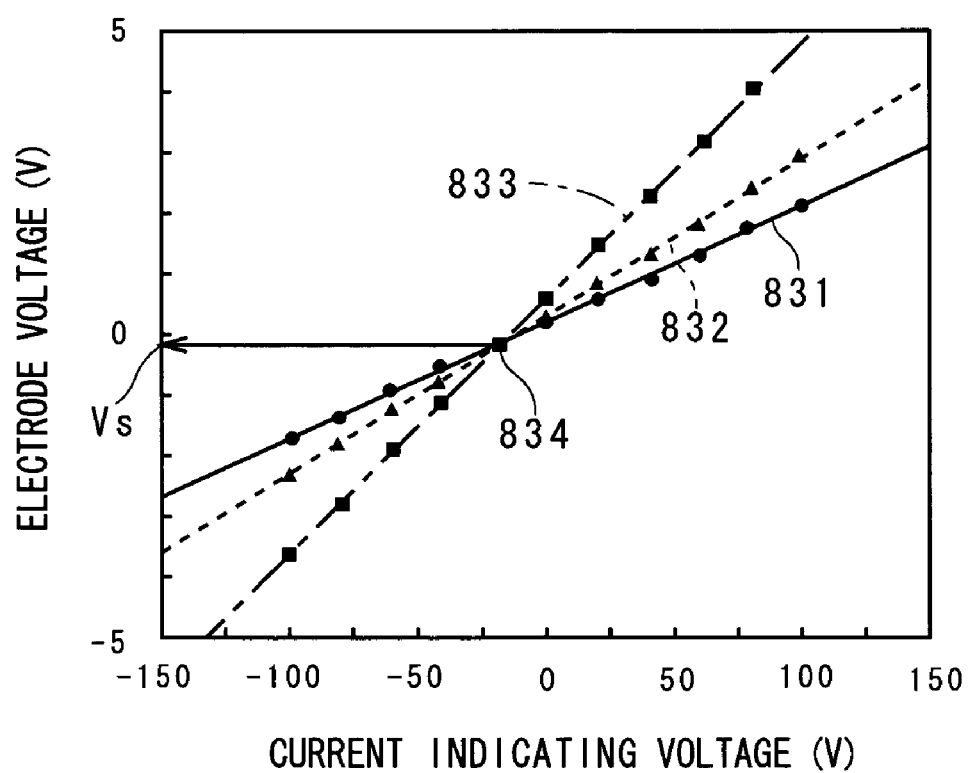
FIG. 9 is a graph showing relationships between a current indicating voltage and an electrode voltage.

FIG. 9 is a graph showing relationships between the current indicating voltage (displacement current) and the electrode voltage which are obtained by the surface voltmeter 1a. In FIG. 9, circular dots represent combinations (discrete relationship) between the current indicating voltages and the electrode voltages which are obtained in a state where the distance between the electrode 12 and the substrate 9 is kept constant. A solid line 831 is a straight line which is obtained from the circular dots with the least squares method and represents a continuous linear relationship between the displacement current and the electrode voltage. Triangular dots represent measurement results which are obtained in a state where an amplitude of the electrode 12 is made smaller than that in the above case of circular dots without changing the distance between the electrode 12 and the substrate 9. Rectangular dots represent measurement results which are obtained in a state where the amplitude of the electrode 12 is made still smaller than that in the case of triangular dots. A broken-line 832 is a straight line derived from the triangular dots and a one-dot chain line 833 is a straight line derived from the rectangular dots.

As shown by the straight lines 831 to 833 in FIG. 9, the relationships between the displacement current and the electrode voltage are represented linearly, and as the amplitude of the electrode 12 increases, the tilt angle of line decreases. The straight lines 831 to 833 meet at a point 834. Since the relationship between the displacement current and the electrode voltage at the point 834 is independent from the amplitude of the electrode 12, similarly to the first preferred embodiment, it is assumed that the displacement current is not actually generated at the point 834 by change of the capacitance between the electrode 12 and the substrate 9. Therefore, in principle, it can be presumed that the reference voltage Vs at the point 834 is equal to the surface voltage on the substrate 9. In the surface voltmeter 1a performing change of the amplitude, it is possible to measure the surface voltage only by electrical control and achieve simplification of the construction of the apparatus. Similarly to the first preferred embodiment, there may be a case where the reference voltage is acquired and stored in the memory 31 of the computer 3 in a state where the substrate 9 is not placed on the substrate holding part 11, to perform calibration for actual measurement. A reference voltage Vs which is out of range of electrode voltages under a plurality of measurement conditions may be obtained as the surface voltage.

In the surface voltmeter 1a in accordance with the second preferred embodiment, similarly to the first preferred embodiment, a surface voltage on the measurement area 92 is measured while applying light to the irradiation region 91 (see FIG. 3) including the measurement area 92 and it is therefore possible to measure a surface voltage on the measurement area 92 with high accuracy, the surface voltage being generated by the charge which is charged on the surface of the insulating film formed on the substrate 9. Since the electrode wiring 164 extends from the electrode 12 in a direction away from the substrate 9 and the substrate holding part 11 along the vibration direction, it is possible to prevent influences of noises and the like caused by vibration of the electrode wiring 164 and to measure the surface voltage on the measurement area 92 more accurately. Further, the irradiation region 91 is defined so as to be larger than the measurement area 92 and include the measurement area 92, to thereby measure the surface voltage on the measurement area 92 with higher accuracy.

In the surface voltmeter 1a, there may be a case where the oscillator 23 is provided with a vibration frequency changing circuit to change a vibration frequency of the electrode 12, a plurality of relationships between the displacement current and the electrode voltage which correspond to a plurality of vibration frequencies are acquired, and then a surface voltage on the substrate 9 is obtained on the basis of the relationships through the same process.

Figure 10:
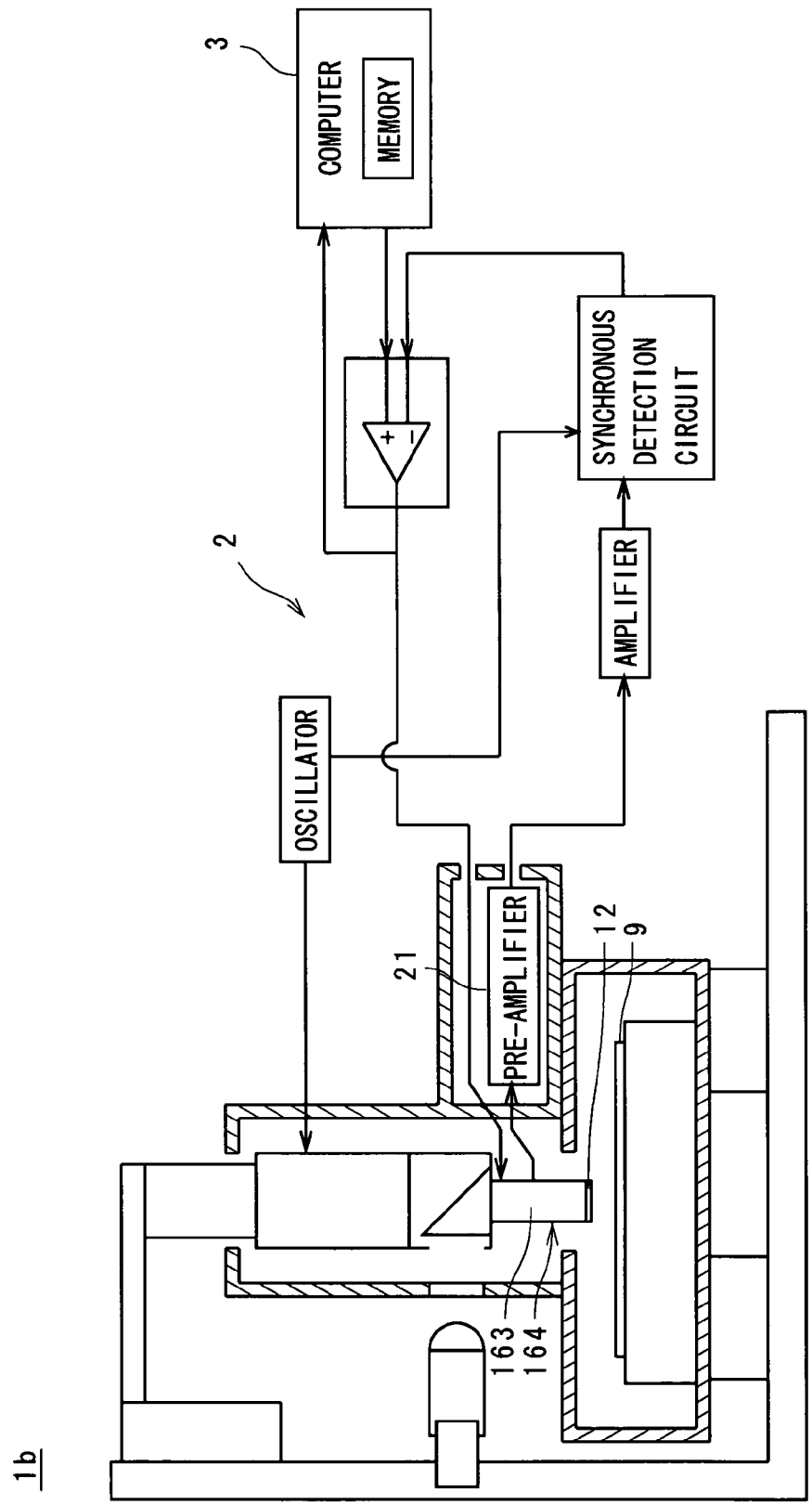
FIG. 10 is a view showing a construction of a surface voltmeter in accordance with the third preferred embodiment.

Next, discussion will be made on a surface voltmeter in accordance with the third preferred embodiment of the present invention. FIG. 10 is a view showing a construction of a surface voltmeter 1b in accordance with the third preferred embodiment. In the surface voltmeter 1b, the pre-amplifier 21 of the processing part 2 is electrically connected to the electrode wiring 164 which is formed on the outer peripheral surface of the glass rod 163. The other constituent elements are the same as those of the surface voltmeter 1 shown in FIG. 1 and represented by the same reference signs in the following description.

In the surface voltmeter 1b, a displacement current from the electrode 12 is acquired by the processing part 2 through the electrode wiring 164 in vibrating the electrode 12. Measurement operations of a surface voltage by the surface voltmeter 1b are the same as those in the first preferred embodiment (see FIG. 4).

Also in the surface voltmeter 1b according to the third preferred embodiment, similarly to the first preferred embodiment, a surface voltage on the measurement area 92 is measured while applying light to the irradiation region 91 (see FIG. 3) including the measurement area 92 and it is therefore possible to measure a surface voltage on the measurement area 92 with high accuracy. Since the electrode wiring 164 extends from the electrode 12 in a direction away from the substrate 9 along the vibration direction, it is possible to measure the surface voltage on the measurement area 92 more accurately. Further, the irradiation region 91 is defined so as to be larger than the measurement area 92 and include the measurement area 92, to thereby measure the surface voltage on the measurement area 92 with higher accuracy.

Like in the second preferred embodiment, a plurality of relationships between the displacement current and the electrode voltage may be acquired in the surface voltmeter 1b while changing an amplitude or a vibration frequency of the electrode 12, instead of the distance between the electrode 12 and the substrate 9.

Though the preferred embodiments of the present invention have been discussed above, the present invention is not limited to the above-discussed preferred embodiments, but allows various variations.

The electrode 12 is not limited to a transparent electrode such as an ITO electrode, as long as the electrode 12 has transparency. A thin film formed of metal may be provided on the lower end surface of the glass rod 163 as the electrode 12. For example, thin film metal which has a double-layered structure consisting of a gold layer of a thickness of 10 nm and a chromium layer of a thickness of 2 nm is used as the electrode 12 and a wavelength of the light emitted from the light source 161 is made to 780 nm, to make a transmittance of light passing through the electrode 12 about 50%. The light source 161 is not limited to an LED, but various kinds of light sources may be used.

The cross section of the glass rod 163 (i.e., the cross section being perpendicular to the vibration direction) is not necessarily a round shape, as far as the glass rod 163 is made to a pillar shape extending in the vibration direction. For example, the cross section of the glass rod 163 may be a polygonal shape. Other pillar-shaped light guiding member (e.g., a conductive rod formed of plastic) may be provided instead of the glass rod 163. Further, the right-angle prism 162 and the electrode 12 may be connected by a hollow cylindrical member through which the reflected light reflected on the right-angle prism 162 passes, instead of the glass rod 163, or the right-angle prism 162 and the electrode 12 may be connected by a non-translucent rod member which is thinner than the glass rod 163.

In the surface voltmeter in accordance with the above preferred embodiments, as the reflective part reflecting the light emitted from the light source 161 and directing the reflected light to the irradiation region 91 on the substrate 9, for example, a reflective mirror may be used instead of the right-angle prism 162. The irradiation region 91 is not necessarily larger than the measurement area 92, as far as it includes the measurement area 92. The size of the irradiation region 91 may be made equal to that of the measurement area 92, if the drift close to the outer peripheral edge of the irradiation region 91 is in a range which does not affect the measurement accuracy of the surface voltmeter.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2007-86248 filed in the Japan Patent Office on Mar. 29, 2007, the entire disclosure of which is incorporated herein by reference.

What is claimed is:

1. A surface voltmeter for measuring a surface voltage on a semiconductor substrate on which an insulating film is formed, comprising:

a substrate holding part for holding a semiconductor substrate;

an electrode facing a measurement area on said semiconductor substrate in a noncontact manner and having transparency;

a light source whose relative position to said substrate holding part is fixed;

a reflective part which reflects light emitted from said light source and directs reflected light to an irradiation region including said measurement area through said electrode;

a vibration part for vibrating said electrode in a vibration direction toward said measurement area, together with said reflective part;

an electrode wiring which is electrically connected to said electrode and extends from said electrode in a direction away from said semiconductor substrate; and an operation part for obtaining a surface voltage on said measurement area on the basis of an electrode voltage applied to said electrode through said electrode wiring and a displacement current from said substrate holding part in vibrating said electrode or a displacement current from said electrode acquired through said electrode wiring in vibrating said electrode.

2. The surface voltmeter according to claim 1, further comprising a light guiding member which is a pillar shape extending in said vibration direction and connects said reflective part and said electrode, said light guiding member directing said reflected light reflected on said reflective part to said electrode, wherein said electrode wiring is a metal film provided on an outer peripheral surface of said light guiding member.

3. The surface voltmeter according to claim 2, wherein said electrode wiring covers a whole of said outer peripheral surface of said light guiding member.

4. The surface voltmeter according to claim 2, wherein said reflective part is a prism.

5. The surface voltmeter according to claim 2, wherein said irradiation region is larger than said measurement area.

6. The surface voltmeter according to claim 5, wherein a distance between an outer peripheral edge of said irradiation region and that of said measurement area is equal to or larger than 50 μm (micrometer).

7. The surface voltmeter according to claim 2, wherein a distance in said vibration direction between said electrode and said measurement area on said semiconductor substrate is equal to or larger than 50 μm and equal to or smaller than 500 μm.

8. The surface voltmeter according to claim 2, wherein a wavelength of said light emitted from said light source is equal to or larger than 230 nm (nanometer) and equal to or smaller than 800 nm.

9. The surface voltmeter according to claim 1, wherein said irradiation region is larger than said measurement area.

10. The surface voltmeter according to claim 9, wherein a distance between an outer peripheral edge of said irradiation region and that of said measurement area is equal to or larger than 50 μm.

11. The surface voltmeter according to claim 9, wherein said reflective part is a prism.

12. The surface voltmeter according to claim 9, wherein a distance in said vibration direction between said electrode and said measurement area on said semiconductor substrate is equal to or larger than 50 μm and equal to or smaller than 500 μm.

13. The surface voltmeter according to claim 9, wherein a wavelength of said light emitted from said light source is equal to or larger than 230 nm and equal to or smaller than 800 nm.

14. The surface voltmeter according to claim 1, wherein said reflective part is a prism.

15. The surface voltmeter according to claim 14, wherein a distance in said vibration direction between said electrode and said measurement area on said semiconductor substrate is equal to or larger than 50 μm and equal to or smaller than 500 μm.

16. The surface voltmeter according to claim 14, wherein a wavelength of said light emitted from said light source is equal to or larger than 230 nm and equal to or smaller than 800 nm.

17. The surface voltmeter according to claim 1, wherein a distance in said vibration direction between said electrode and said measurement area on said semiconductor substrate is equal to or larger than 50 μm and equal to or smaller than 500 μm.

18. The surface voltmeter according to claim 1, wherein a wavelength of said light emitted from said light source is equal to or larger than 230 nm and equal to or smaller than 800 nm.

* * * * *